United States Patent [19]

Glasbergen

[11] 4,386,325

[45] May 31, 1983

[54] CIRCUIT ARRANGEMENT FOR REPRODUCING IN AN OUTPUT CIRCUIT A CURRENT FLOWING IN AN INPUT CIRCUIT

[75] Inventor: Johannes W. Glasbergen, Hilversum, Netherlands

[73] Assignee: U.S. Philips Corporation, New York, N.Y.

[21] Appl. No.: 309,950

[22] Filed: Oct. 9, 1981

[30] Foreign Application Priority Data

Nov. 12, 1980 [NL] Netherlands ........................ 8006164

[51] Int. Cl.[3] ............................................ H03F 3/04

[52] U.S. Cl. ............................................ 330/288

[58] Field of Search ................ 330/257, 288; 323/315, 323/316

[56] References Cited

U.S. PATENT DOCUMENTS

| | | | |
|---|---|---|---|
| 3,822,387 | 7/1974 | Mulder | 307/299 B |
| 4,103,249 | 7/1978 | Burdick | 330/288 |

*Primary Examiner*—James B. Mullins

*Assistant Examiner*—Gene Wan

*Attorney, Agent, or Firm*—Thomas A. Briody; William J. Streeter; Edward W. Goodman

[57] ABSTRACT

A circuit arrangement for reproducing in an output circuit (4) a current (i1) flowing in an input circuit (1) comprises a PNP-current mirror (2) to the input (2-1) of which the input circuit (1) is connected. The mirror output (2—2) is connected to the emitter of an output transistor (3) of the PNP-type the collector of which is connected to the output circuit (4). The base of the transistor (3) is connected to the input (5-1) of an NPN-current mirror (5), whose output (5-2) is connected to the input (2-1) of the PNP-current mirror (2), so that the effect of the base current (ib) of the transistor on its collector current will be compensated for.

1 Claim, 1 Drawing Figure

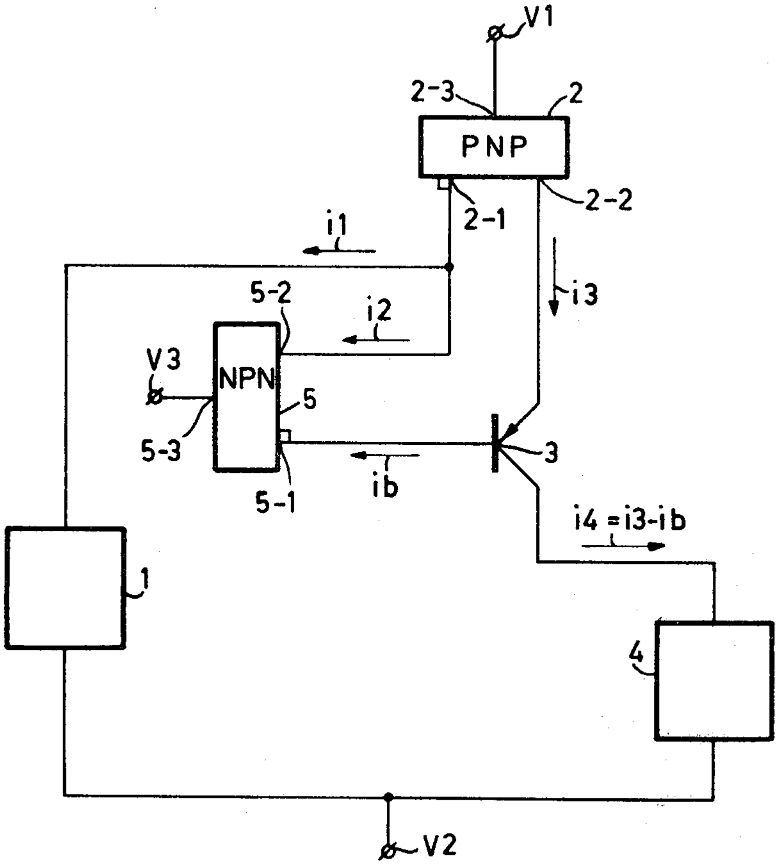
V1
2-3
2
PNP
2-2
2-1
i1
i3
5-2
i2
V3
NPN
5
3
5-3
5-1
ib
i4 =i3-ib
1
4
V2

CIRCUIT ARRANGEMENT FOR REPRODUCING IN AN OUTPUT CIRCUIT A CURRENT FLOWING IN AN INPUT CIRCUIT

The invention relates to a circuit arrangement for reproducing in an output circuit a current flowing in an input circuit, comprising a current mirror of a first conductivity type to which the input circuit is connected and comprising an output transistor to which the current mirror is connected, said output transistor being connected to the output circuit.

Such an arrangement is disclosed in U.S. Pat. No. 4,103,249. In this arrangement the base currents of the PNP-transistors of the PNP-current mirror are compensated for by the base currents of a second pair of PNP-transistors, using a second current mirror of the NPN conductivity type.

In such an arrangement accurate compensation for the base currents depends on the equality of the two pairs of PNP-transistors, which in practice is difficult to guarantee.

The invention has for its object to provide an arrangement of the above-mentioned type wherein the output current can be made equal to the input current to a more accurate degree.

To this end, the arrangement is characterized in that the output transistor is of the first conductivity type and has its base connected to the input of a second current mirror of a conductivity type which is the opposite of the first conductivity type, the output of the second mirror being connected to the input of the first-mentioned current mirror and to the input circuit, the output of the first-mentioned current mirror being connected to the emitter of the output transistor, and the collector of the output transistor being connected to the output circuit.

An embodiment of the invention will be described, by way of example, with reference to the accompanying diagrammatic drawing, the sole FIGURE of which is the circuit diagram of the embodiment.

In the drawing a circuit arrangement for reproducing in an output circuit 4 a current flowing in an input circuit 1 comprises a PNP current mirror 2 to the input 2-1 of which is connected one end of the input circuit 1. The output 2-2 of current mirror 2 is connected to the emitter of an output transistor 3 of the PNP-conductivity type, whose collector is connected to one end of the output circuit 4.

Statements herein that a current mirror is of a specific conductivity type are to be taken only as specifying the direction of flow of conventional currents at its input and its output in operation. If these currents flow from the exterior to its input and its output then it is to be considered as being of the npn conductivity type and if they flow to the exterior from its input and its output then it is to be considered as being of the pnp conductivity type.

The base of the output transistor 3 is connected to the input 5-1 of an NPN-current mirror 5, whose output 5-2 is connected to the input 2-1 of the PNP-current mirror 2.

The common terminal 2-3 of the current mirror 2 is connected to a terminal of a supply source, not shown, which produces a supply voltage V1 thereat. The common terminal 5-3 of the current mirror 5 carries a voltage V3. The input circuit 1 and the output circuit 4 are returned to a reference voltage V2. It holds that $V1>V3>V2$.

In the ideal case of a one-to-one transfer ratio of the current mirrors 2 and 5 it holds that:

$i2=ib$ $i3=i1+ib$ so that the current $i4=i3-ib$ which flows through the output circuit 4 is equal to the current i1 flowing through the input circuit 1.

In a practical arrangement in which the transfer ratio from the input to the output of the current mirror 5 is 1:0,98 and that of current mirror 2 is 1:0,95 and the transistor 3 has a collector/base current ratio of 3 it holds that:

$i4=0.928\ i1$

For the same case, having however a transfer ratio of 1:1 for the current mirror 2 it holds that:

$i4=0{,}993\ i1$.

Increasing the current gain of the output transistor 3 from 3 to 4 yields for the above-mentioned two cases $i4=0{,}938\ i1$ and $i4=0{,}995\ i1$ respectively.

It should be noted that the arrangement shown can be used with particular advantage if it is required that the current 13 can be applied under the control of switching signals either to the output circuit 4 via the PNP-transistor 3 shown or to another output circuit via a different PNP-transistor, not shown, the requirement being imposed that the ratio between the currents in the two output circuits is as close as possible to unity. Then, in a similar way as for the first PNP-transistor, the base current for the second PNP-transistor will have to be fed back to its emitter via an NPN-current mirror and the PNP-current mirror.

If the current gain of one PNP-transistor is 3 in such an arrangement and the current gain of the other transistor is 4, then it is possible to calculate for the two above-mentioned cases that the ratios between the currents in the two output circuits are $0{,}928/0{,}938=0{,}989$ and $0{,}993/0{,}995=0{,}998$ respectively.

What is claimed is:

1. A circuit arrangement for reproducing in an output circuit a current flowing in an input circuit, comprising a current mirror of a first conductivity type to which the input circuit is connected and comprising an output transistor to which the current mirror is connected, said output transistor being connected to the output circuit, characterized in that the output transistor is of the first conductivity type and has its base connected to the input of a second current mirror of a conductivity type which is the opposite of the first conductivity type, the output of the second current mirror being connected to the input of the first-mentioned current mirror and to the input circuit, the output of the first-mentioned current mirror being connected to the emitter of the output transistor and the collector of the output transistor being connected to the output circuit.

* * * * *